United States Patent [19]

Remise et al.

[11] Patent Number: 5,136,466

[45] Date of Patent: Aug. 4, 1992

[54] MOUNTING DEVICE FOR DETACHABLY MOUNTING A PLURALITY OF COMPUTER PERIPHERALS

[75] Inventors: Rene Remise; Pierre Odo, both of Les Ulis, France

[73] Assignee: Bull, S.A., Paris, France

[21] Appl. No.: 592,474

[22] Filed: Oct. 5, 1990

[30] Foreign Application Priority Data

Oct. 5, 1989 [FR] France .................. 89.13034

[51] Int. Cl.$^5$ .................. H05K 7/14; H05K 7/16
[52] U.S. Cl. .................. 361/391; 361/393
[58] Field of Search .................. 220/3.7, 3.92; 361/380, 361/391, 392, 393, 394, 395, 399, 412, 415, 429; 248/346, 672

[56] References Cited

U.S. PATENT DOCUMENTS

| | | | |
|---|---|---|---|
| 2,168,984 | 8/1939 | Grimes | 361/391 |
| 2,584,173 | 2/1952 | Fowler | 361/391 |
| 4,135,337 | 1/1979 | Medlin | 220/3.92 X |
| 4,159,506 | 6/1979 | Latasiewicz et al. | 361/399 |
| 4,268,100 | 5/1981 | Kekas et al. | 361/391 X |
| 4,336,569 | 6/1982 | Tsuda et al. | 361/395 |
| 4,599,485 | 7/1986 | Smolik | 220/3.7 X |
| 4,725,244 | 2/1988 | Chewning et al. | 364/708 X |
| 4,754,397 | 6/1988 | Varaiya et al. | 361/391 X |
| 4,882,655 | 11/1989 | Pavie | 361/395 X |
| 4,937,806 | 6/1990 | Babson et al. | 361/391 X |
| 4,964,017 | 10/1990 | Jindrick et al. | 361/395 X |

FOREIGN PATENT DOCUMENTS 3523830 1/1987 Fed. Rep. of Germany ...... 361/399

OTHER PUBLICATIONS

IBM Technical Disclosure Bulletin, vol. 30, No. 1, Jun. 1987 pp. 392-393; "Direct-Access Storage Device Commodity-Stacking Plates".

IBM Technical Disclosure Bulletin, vol. 29, No. 12, May 1987, pp. 5292-5293; "Grounded File-Mounting Plate".

IBM Technical Disclosure Bulletin, vol. 30, No. 2, Jul. 1987, pp. 882-887; "Direct Access Storage Device Commodity Assembly Integration Into the IBM Personal Computer XT Envelope".

IBM Technical Disclosure Bulletin, vol. 31, No. 6, Nov. 1988, pp. 410-414; "Direct Access Storage Device Frame Assembly and Frame-Mounting Device".

IBM Technical Disclosure Bulletin, vol. 27, No. 8, Jan. 1985, pp. 5022-5023; "Drive Spring Lock" G. Escobar and J. H. Neer.

Research Disclosure No. 293, Nov. 1987.

Primary Examiner—Leo P. Picard
Assistant Examiner—Michael W. Phillips
Attorney, Agent, or Firm—Kerkam, Stowell, Kondracki & Clarke

[57] ABSTRACT

A mounting or fixation device for computer peripherals is proposed, which includes a support part (1), mounted solidly but removably to the chassis (90, 91, 92) of a microcomputer, the device having a first set of pins (103) disposed on a first surface (10) and a second set of pins disposed on an elastic plate disposed perpendicularly to the first surface and parallel to the first set of pins for mounting a first computer peripheral to the support part, the plate being fixed either removably or nonremovably and including the second set of pins formed in the plate, the second set of pins being formed at a distance corresponding to the distance of the fixation holes of the peripheral housing to penetrate these holes when the peripheral is mounted to the support part.

17 Claims, 9 Drawing Sheets

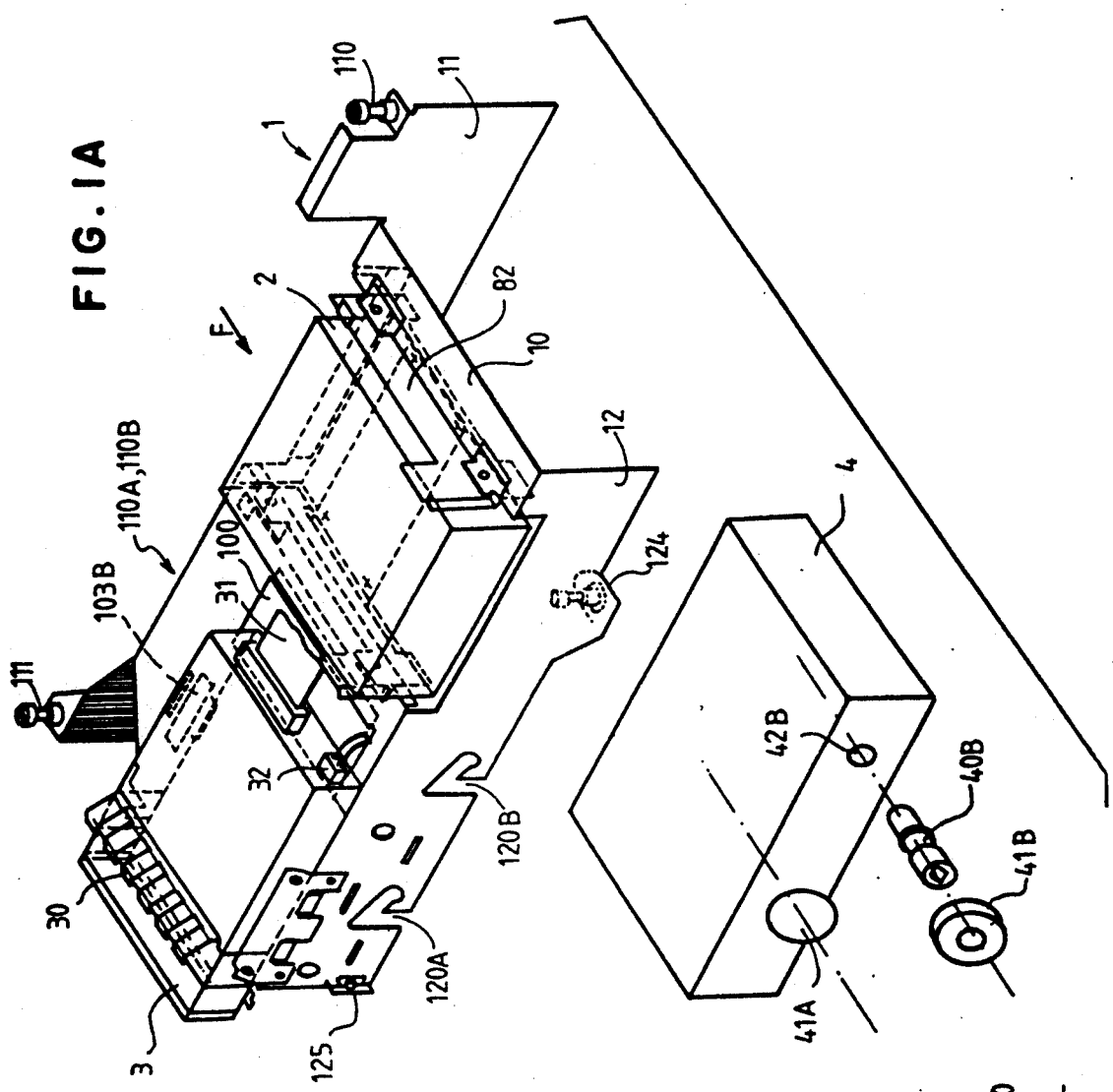
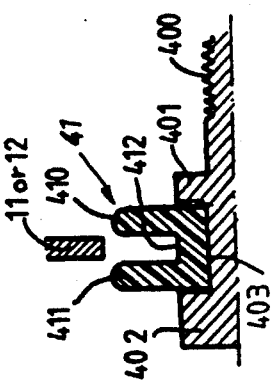
FIG. 1A
FIG. 1B

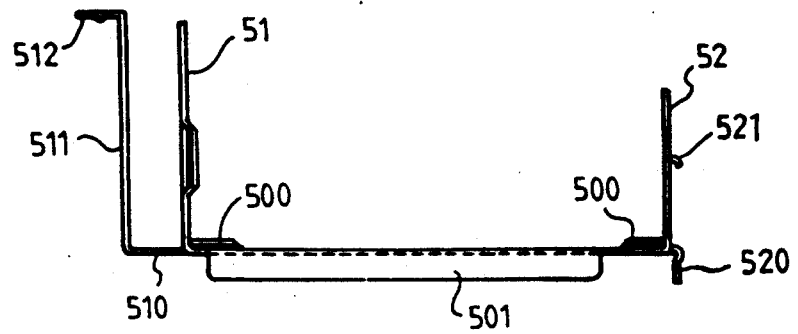
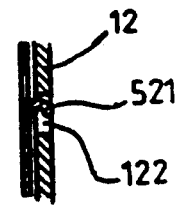
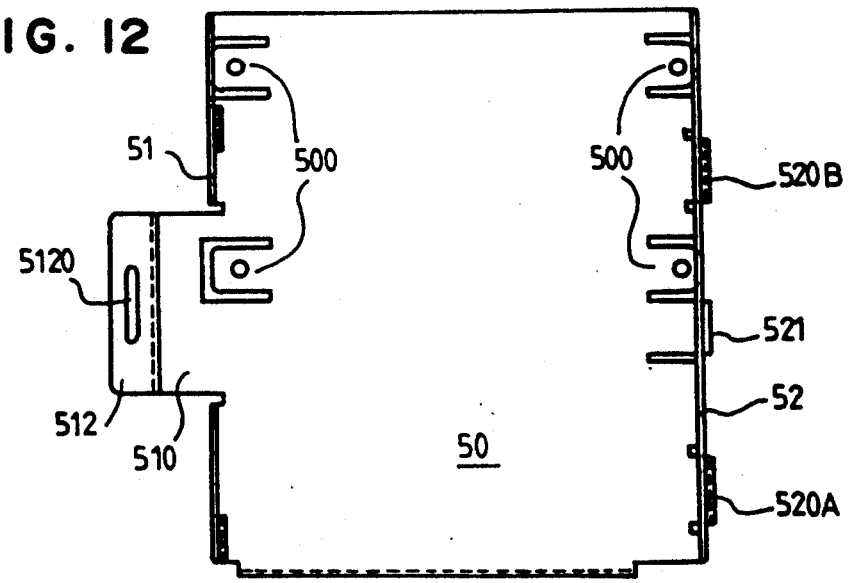

MOUNTING DEVICE FOR DETACHABLY MOUNTING A PLURALITY OF COMPUTER PERIPHERALS

FIELD OF THE INVENTION

The present invention relates to a mounting or fixation device for computer peripherals.

BACKGROUND OF THE INVENTION

Particularly in the field of microcomputers, it is known to use mounting or fixation devices for computer peripherals. However, these devices do not enable rapid mounting of the peripheral to make the basic configuration.

OBJECTS AND SUMMARY OF THE INVENTION

It is consequently a first object of the invention to enable fast, automatable mounting of a peripheral which is a part of the basic configuration of a microcomputer, such as a disk drive or reader.

This object is attained in that the mounting or fixation device includes a support part, mounted solidly but removably to the chassis of a microcomputer, and first means for mounting or fixation of a peripheral the first means comprising a first set of pins disposed on a first surface and an elastic plate disposed perpendicular to the first surface and parallel to the pins; the plate being fixed either removably or nonremovably and includes a second set of pins formed in the plate, and the second set of pins are formed at a distance corresponding to the distance of the fixation or mounting holes of the peripheral housing and penetrate these holes when the peripheral is put into place.

According to another feature of the invention, the plate is mounted removably on a second surface perpendicular to and integral with the first surface, in a direction opposite that of the first pin, by sliding two stamped tabs of the plate under tongues of the second surface obtained by stamping and deforming the second surface and via bosses on the second surface, which clip into corresponding receptacles of the plate.

Another object of the invention is to permit the mounting or fixation of several different types of peripherals on the same support, for example, an ultra-high-speed magnetic tape unwinder cartridge (known as a streamer), a disk drive or reader unit, or a hard disk.

This object is attained in that the support part includes a third surface perpendicular to the first surface and parallel to the second surface, so as to form a U shape, associated with second means for removable mounting or fixation of a peripheral mounted between the shanks of the U of the support part.

Another object is to permit the mounting of fragile peripherals.

This object is attained in that the second mounting or fixation means comprise vertical cutouts that are inclined in ramplike fashion, with a mounting or fixation point made in each of the second and third surfaces, to receive grommets of elastic, cushioning material mounted on mounting or fixation screws screwed into the mounting or fixation holes of a peripheral housing; the grommets slide into the cutouts and assure the fixation and cushioned mounting of the peripheral.

A further object of the invention is to enable the mounting of a peripheral housing with a 3½ inch format, for example, which is smaller than the format comprising the distance separating the shanks of the support part, which substantially corresponds to the 5¼ inch format.

This object is attained in that the second mounting or fixation means comprise a U-shaped stirrup mounted removably via a joint solidly attached to a first shank of the U and suspended from the first surface by an elastic tongue that includes an interlocking tongue, which after having passed through an opening of the first surface is intended to press against the upper face of the first surface; another shank of the U comes to rest against the lower face of the first surface in proximity with the interlocking tongue.

The joint, which is solid with the first shank of the U, may include means for positioning the horizontal surface of the stirrup once the shank is interlocked; this positioning means comprising a folded edge that comes to rest on the upper portion of a stamped tab provided for this purpose in the second surface, while the tongues that form the joint rest against the lower portion of stamped tabs provided in the second surface.

Another object of the invention is to permit mounting of a supplementary peripheral, such as a hard disk, in such a way that although access to it from outside the microcomputer housing during operation is not required, still when the housing is open, easy access to elements disposed underneath this peripheral on the main electronic board of the machine is provided.

This object is attained by including an opening in the first surface, behind the first means for solidly attaching a first peripheral. This opening is intended to receive third means for mounting or fixation of a peripheral mounted in a direction perpendicular to the direction of the first peripheral; the third means enable temporary tilting of the peripheral for access to a connector located on a printed wiring board on which the support part is mounted.

In another feature, the third mounting or fixation means comprises a U-shaped stirrup, the side shanks of which are extended to the front and rear of the central portion of the U by arms; at least one pair of arms disposed facing one another includes means of pivotable connection to the sides of the opening, and the other pair of arms includes means for snap locking to the surfaces of the opening provided for this purpose, to constitute the position for use of the peripheral, and the elasticity of the second pair of arms enables them to be disengaged from the snap-locked condition to allow the tilting.

A final object of the invention is to propose a use of the computer peripheral mounting or fixation device.

This object is attained by mounting the device by sliding it between grooves, made by the bosses made on the front and rear panels of the computer chassis; the grooves are solidly attached both to them and to a printed wiring board resting on the bottom of the computer chassis by detachable mounting or fixation means.

Further characteristics and advantages of the present invention will become more apparent from the ensuing detailed description, taken in conjunction with the drawings.

BRIEF DESCRIPTION OF THE DRAWINGS

FIG. 1A is a perspective view of the mounting or fixation device associated with a second fixation means according to the invention;

FIG. 1B is a sectional view of the construction of the mounting screw of FIG. 1A.

FIG. 11A is a side view of the second peripheral mounting or fixation means, smaller in size than the support part; and FIG. 11B is an exploded sectional view of one of the mounting surfaces of the second peripheral mounting means of FIG. 11A; FIG. 11C is an exploded view of a tongue of the second peripheral mounting means of FIG. 11A;

FIG. 12 is a plan view of this mounting or fixation means.

DESCRIPTION OF THE PREFERRED EMBODIMENTS

Figure 2:
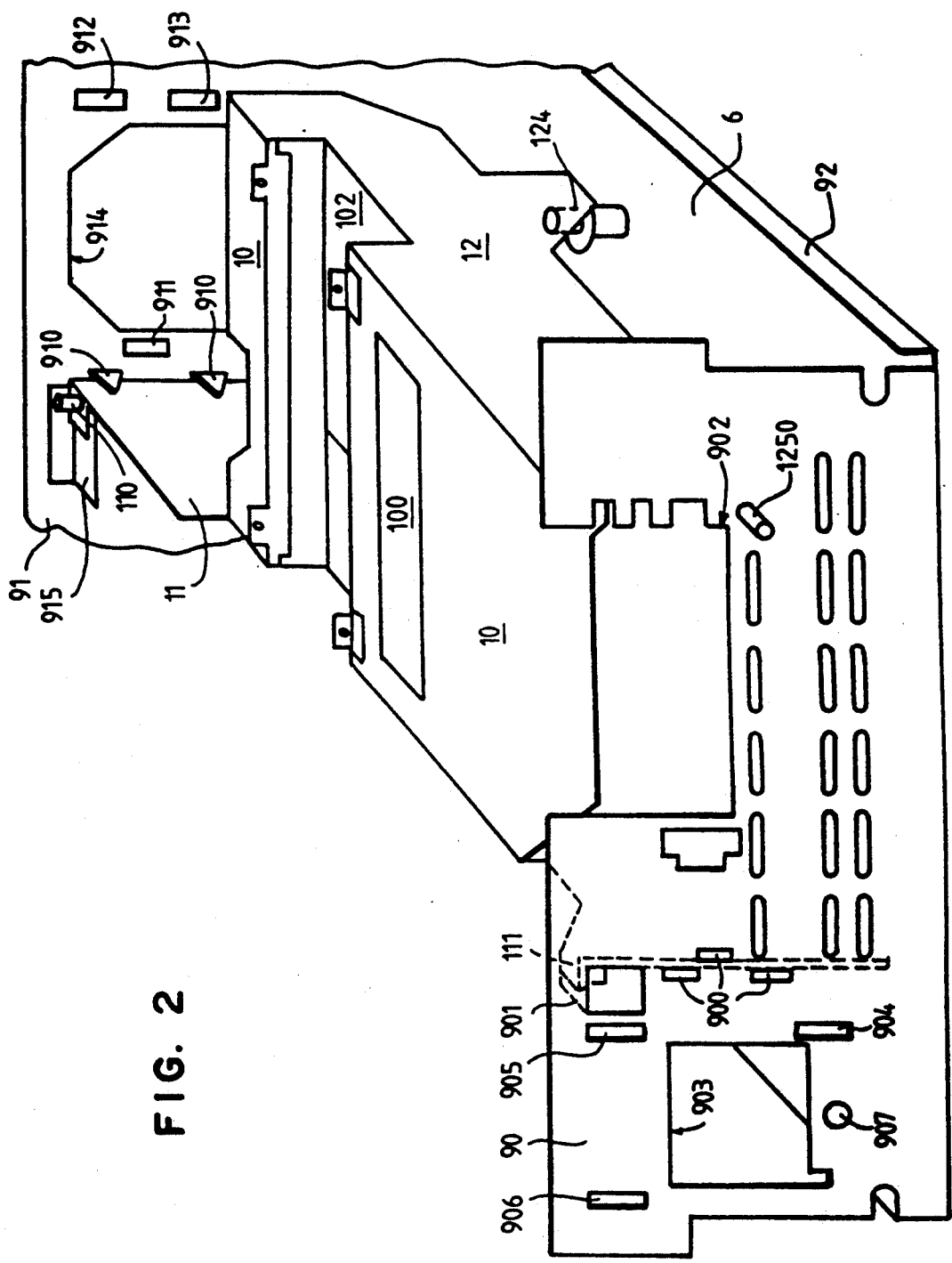
FIG. 2 is a perspective view of a support part, mounted in the chassis of a machine.

The mounting or fixation device according to the invention, shown in FIG. 1A, makes it possible to mount a first computer peripheral, comprising a disk drive or reader 3, on a support part 1 in such a way that it is accessible by the front face 90 (see FIG. 2) of the chassis of a machine comprising a microcomputer, in which the peripheral fixation device is mounted. This disk drive or reader 3 comprises the basic configuration of the machine.

This peripheral mounting or fixation device also makes it possible to mount an optional hard disk drive or reader 2 in a direction perpendicular to the direction of the disk drive or reader, and behind it, to enable optimal use of the available space behind the disk drive or reader 3.

Figure 3:
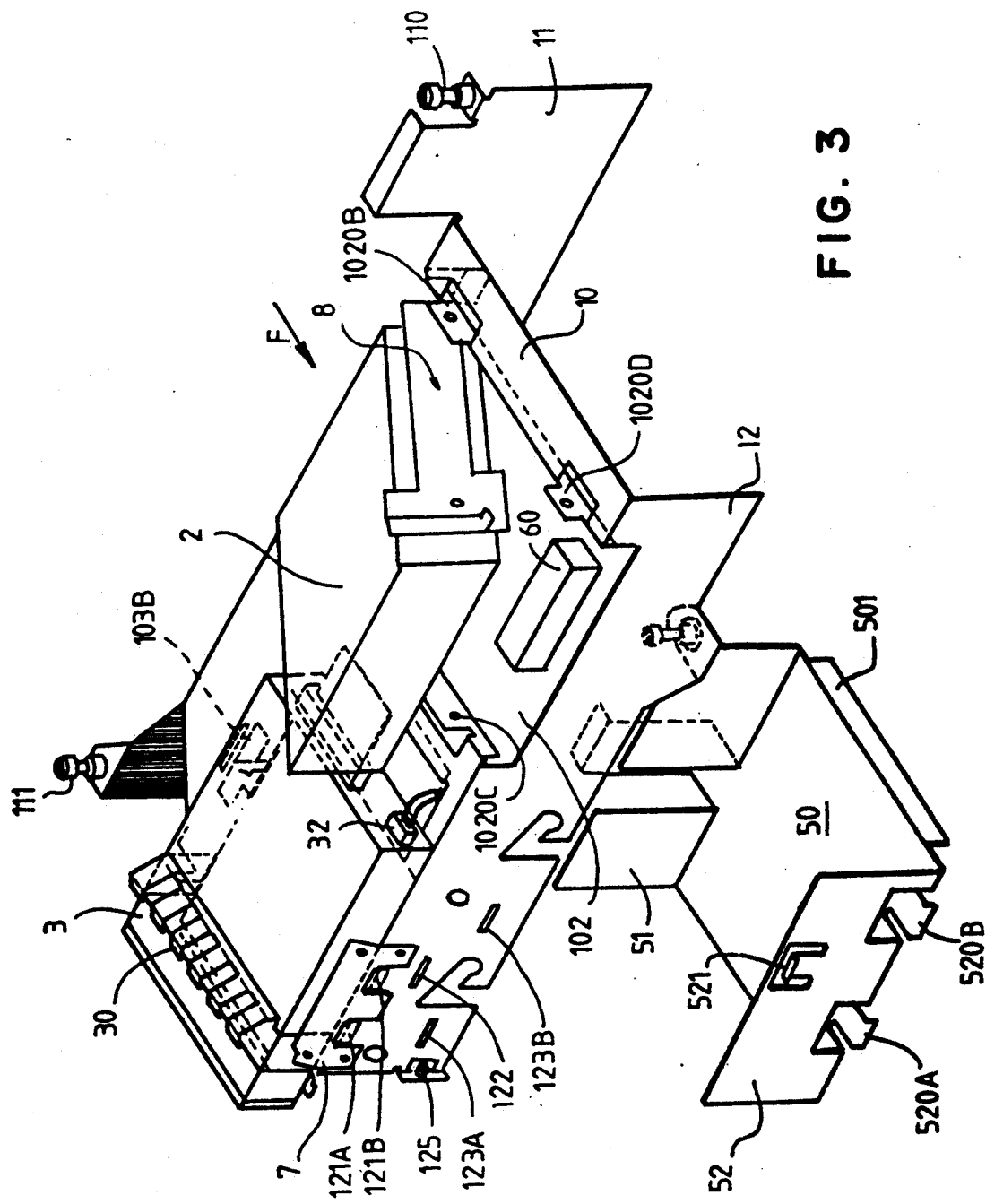
FIG. 3, is a perspective view of the mounting or fixation device with an alternative preferred embodiment of a second mounting on fixation means.

As shown in FIG. 3, this hard disk drive or reader 2 is mounted on a cradle 8 that pivots about the joint 1020B, 1020A (FIG. 4) in such a way as to enable access to the electronic equipment, for instance comprising connectors 60, disposed on the printed wiring board 6 (see FIG. 6), on which the support part 1 will be fixed, for example, by a screw extending through tab 124 having a nut disposed therein.

Figure 4:
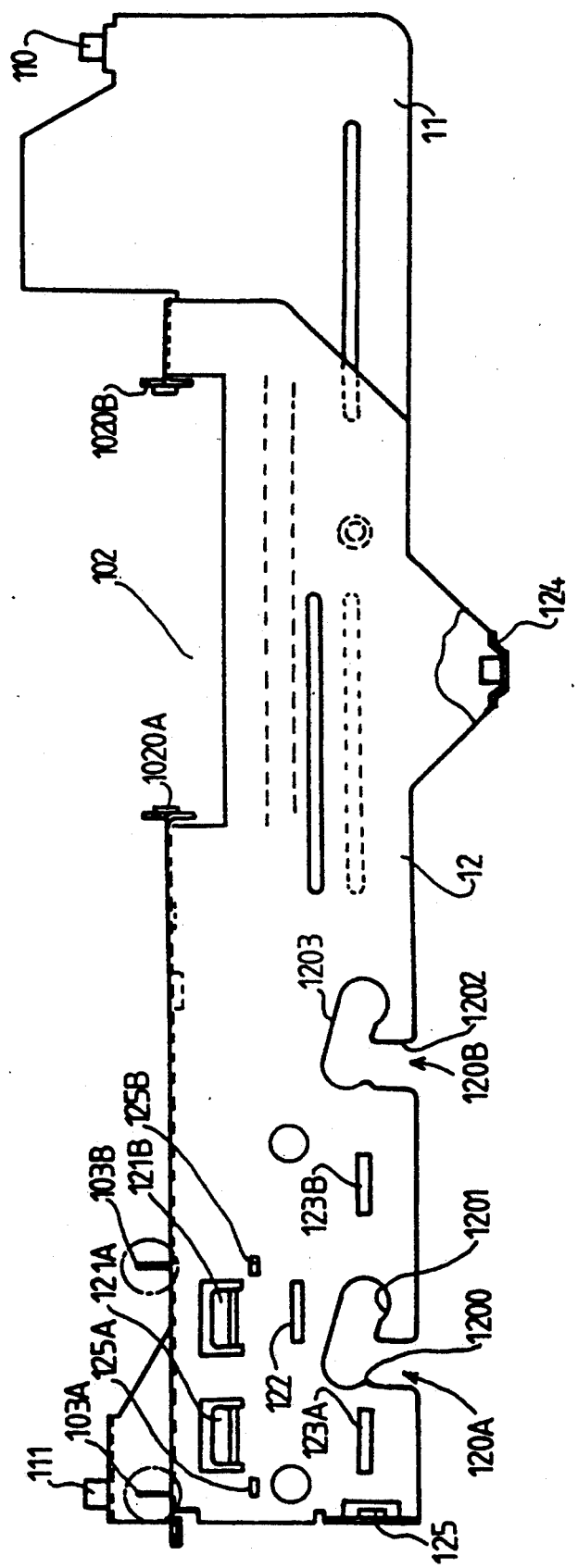
FIG. 4 is a side view of the support part.
Figure 5:
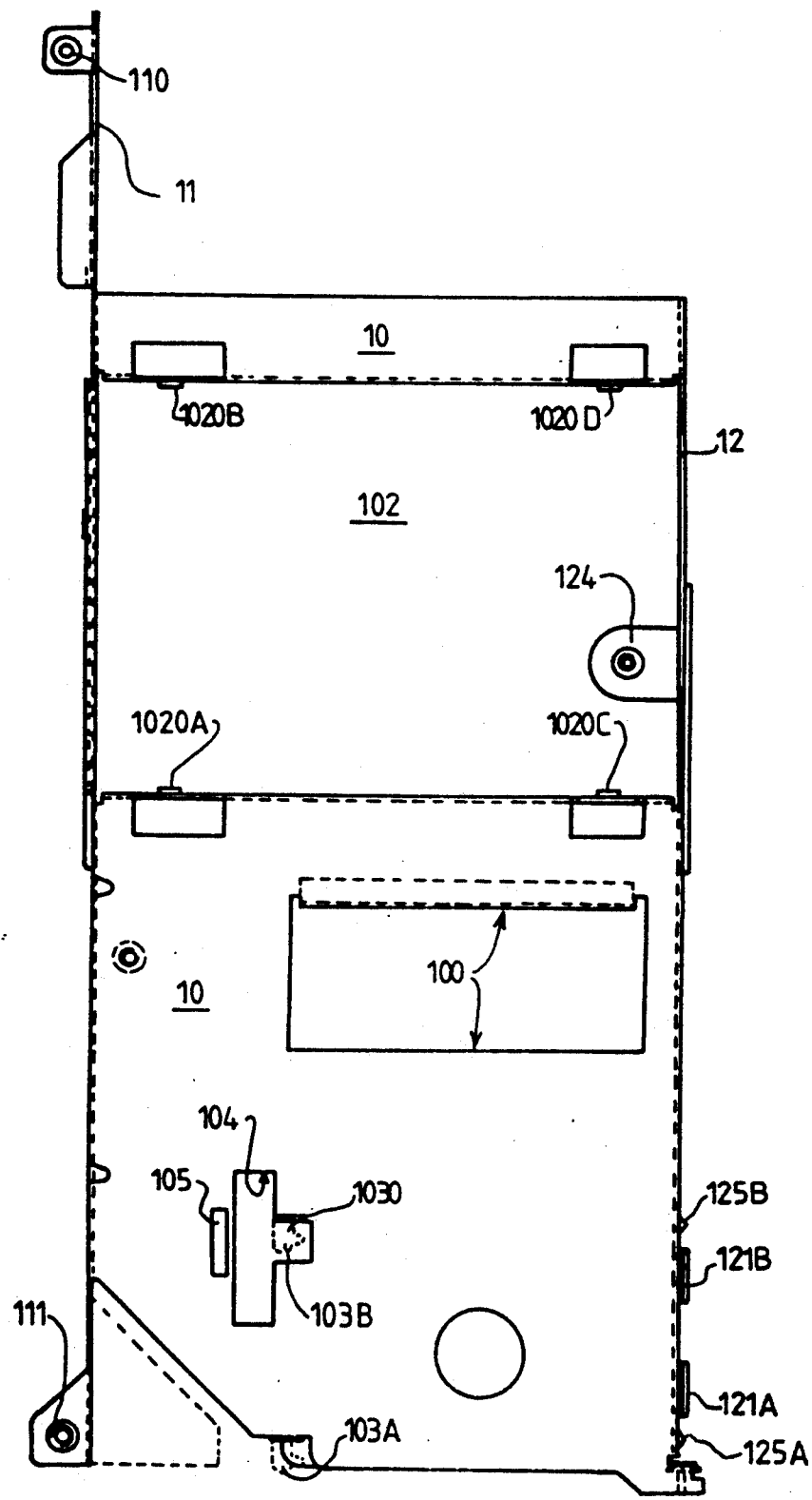
FIG. 5 is a plan view of the same support part.

As shown in FIG. 3, the connector 60 faces the opening made in the upper surface 10 of the support part 1. The support part 1, as shown in FIGS. 4 and 5, includes a first surface 10 provided with an opening 102 intended to receive the mounting or fixation means, shown in FIG. 3 in the form of cradle or stirrup 8 intended for the hard disk 2, and an opening 100 (FIG. 1A) intended to enable the passage of sheets of wire mesh that via the connectors 31, 32 (FIGS. 1A and 3) connect the disk drive or reader 3 to the electronic circuit on the board 6. The support part 1 also includes a second surface 12 perpendicular to the first and oriented downward in such a way that with a third surface 11 it forms a part the cross section which is substantially in the form of a U.

The second and third surfaces 12, 11, respectively, of the support part 1 include one pair of cutouts 120A, 120B and 110A, 110B, respectively (see FIG. 1A), on each surface 12 and 11; each pair comprises one vertical cutout 1202, which is extended laterally by an inclined ramp 1203 and ends at a locking point comprising a boss 1201, as can be best seen in FIG. 4.

The vertical cutout 1202 also includes a boss 1200 on one of its sides, making it possible to form a hard point that prevents overly easy passage from the inclined portion to the vertical portion. The inclined portion 1203 is inclined downward at an angle of less than 90° with respect to the vertical portion. These pairs of cutouts made in the side surfaces 11, 12 of the support part 1 enable the mounting of an optional peripheral element, as shown in FIG. 1A, this element for instance comprising a 5¼-inch disk drive or reader, or a high-speed tape cassette unwinder 4. The peripheral housing 4 is provided on each of its longitudinal side faces 42 with threaded holes, for example 42B, receive the corresponding thread 40B, of a screw, the head of which, for instance in the form of a hexagon socket, enables the mounting or fixation to the body of the housing 4. This screw, shown on a larger scale in the sectional view of FIG. 1B, includes in addition to its thread 400 a shoulder 401 that with the head 402 comprises a throat 403 in which a grommet 41 is accommodated. One grommet 41B, for example, of elastic material is associated with each screw 40B. The grommet 41 comprises a disk 411, separated from a second disk 410 by a groove corresponding to the thickness of the second and third side surfaces 12 or 11 of the support part 1. The two disks 411, 410 are joined together by a central junction portion 412. The set made by each grommet, screw and cutout 120 forms an element for suspension and mounting or fixation of the peripheral housing, with a cushioning means comprising the grommet of elastic material.

Figure 6:
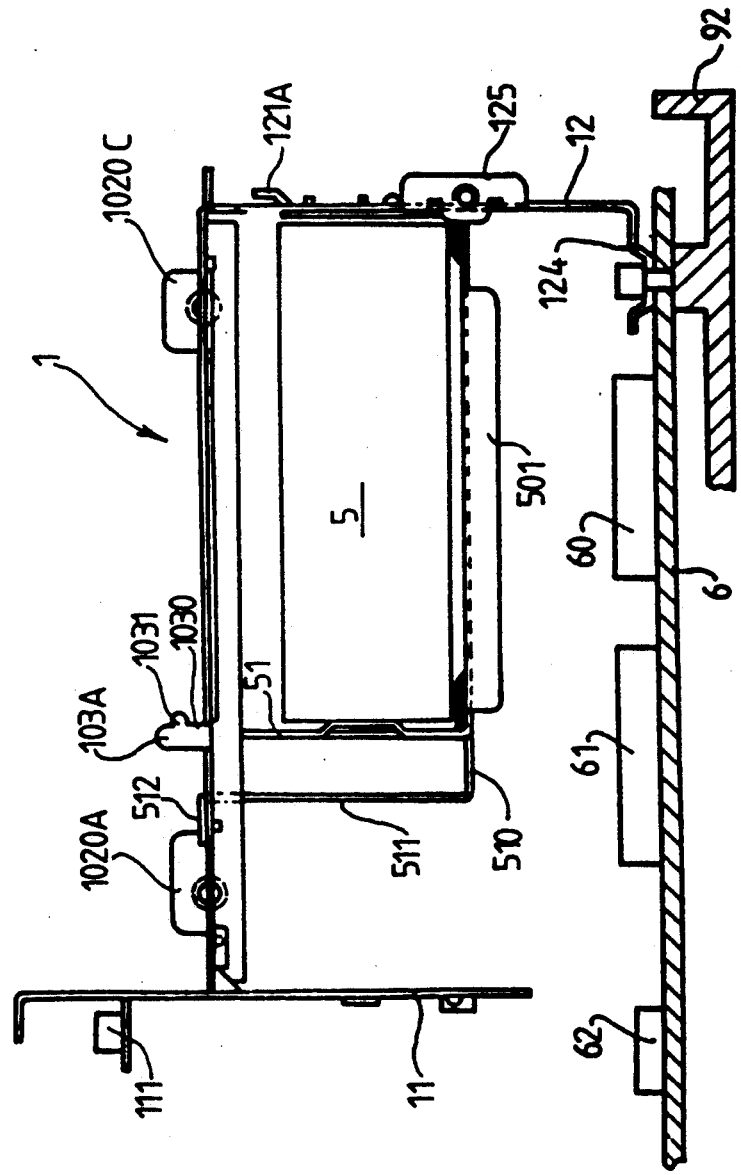
FIG. 6 is a view from the front of the support part associated with a printed wiring board and a second peripheral mounting or fixation means.

FIG. 3 shows an alternative structure, in which instead of a peripheral corresponding to a 5¼-inch module, a peripheral of a smaller dimension is mounted, corresponding to the 3½-inch peripheral standard, for the distance between the side surfaces 12, 11 of the support part 1. To do this, a second mounting or fixation means 50, 51, 52 for the peripheral 5 (see FIG. 6) is used, comprising a stirrup, which includes a central portion 50 and lateral shanks 52, 51, substantially forming a part of U-shaped cross section. The horizontal part 50 is extended to the front and back by a tongue 501 bent along a perpendicular plane, in such a manner as to comprise a stiffening reinforcement for this surface. Similarly, this surface 50 includes bosses 500 (see FIG. 12) making it possible to have the peripheral 5 rest against this boss, as shown in FIG. 6, and to retain the peripheral with screws that pass through the holes made on these bosses 500, wherein the screws will be screwed into the corresponding threaded portions of the housing 5 (not shown).

The set comprising the housing 5 and fixation means 50, 51, 52 is mounted by pivoting, causing the tongues 520A, 520B (FIGS. 3 and 12) to interlock with the stamped tabs 123A, 123B provided on the second surface 12 (FIG. 4). By pivoting, the surface 52 is put into contact with the surface 12, which enables the tongue 521, shown in FIG. 11, to penetrate the stamped slot 122 of the surface 12 (FIGS. 3, 4 and 11A-C), to come to rest against the upper portion of this stamped slot 122, while the tongues 520 rest on the lower portions of the stamped tabs 123. At the same time, the tongue 510 that extends the horizontal surface 50 includes a portion 511 perpendicular to this tongue 510, and ends in a horizontal portion 512 provided with a boss 5120, which by elastic deformation causes this horizontal part 512 to pass through a cutout 104 provided on the first surface 10 in such a manner as to position the boss 5120 facing the cutout 105, wherein boss 5120 will engage cutout 105 and will thus hinder the removal of the tongue 512. The length of the portion 511 and of the shanks 51 comprising the stirrup of U-shaped cross section, comprising the surfaces 51, 50, 52, is calculated so that when the tongue 512 rests on the upper face of the first surface 10, the end of the shanks 51 of the U-shaped suspension means for the peripheral housing 5 rests on the lower face of the surface 10, as shown in FIG. 6.

Figure 8:
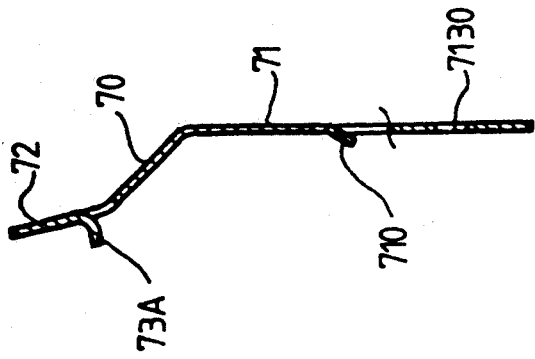
FIG. 8 is a sectional view of the clip that holds a disk drive or reader.
Figure 7A:
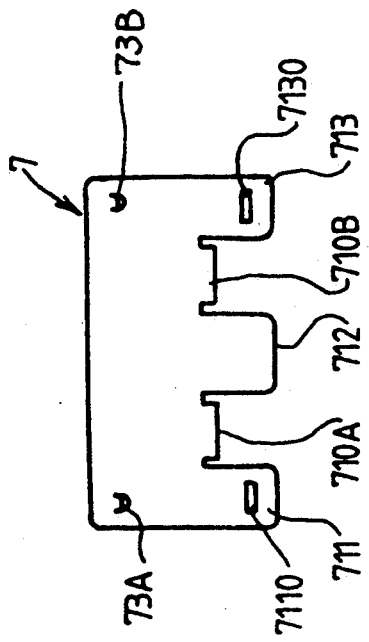
FIG. 7A is a side view of the holding clip for the disk drive or reader.
Figure 7B:
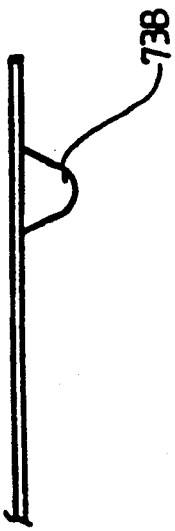
FIG. 7B is a plan view of a portion of the holding clip of FIG. 7A.

The advantageous manner of mounting or fixation of a first peripheral comprising the basic configuration of the machine is embodied by a pair of pins 103A, 103B (FIG. 4). Each pin comprises a dog point 1030 cut out in the surface 10, as shown on dashed lines in FIG. 5, and bent perpendicular to this surface, as shown in FIGS. 4 and 6. At a distance corresponding to the placement of the peripheral mounting or fixation holes of the first peripheral and oriented along the axis of symmetry of the second peripheral, or in other words perpendicular to the axis of symmetry of the first peripheral, this dog point 1030 includes a pin 1031. Associated with this rigid, fixed pair of pins 103A, 103B is a second pair of pins 73A, 73B mounted on an elastic plate 7, shown in FIG. 7A. This elastic plate 7 includes an inclined portion 70 (FIG. 7B). that lends it its elasticity, and a plane portion 71 that enables its fixation to the side surface 12. This mounting of fixation is effected by means of tongues 121A, 121B cut out in the surface 12, as shown in FIGS. 4 and 5. These tongues 121A, 121B, which project slightly relative to the surface 12, enable sliding the stamped tabs 710A, 710B in the elastic plate 7 between this surface 12 and the inside surface of the tongues. As shown in FIG. 8, these stamped tabs 710A, 710B include a slight taper 710 that facilitates their introduction into the tongues. The stamped tabs 710A, 710B form three shanks 711, 712, 713 in the elastic plate, of which the two outer shanks 711, 713 are provided with respective openings 7110, 7130, which enable them to receive bosses 125A, 125B formed on the surface 12 to prevent upward displacement of the elastic plate 7 once it has been put in place on the surface 12. The support part 1, thus provided with the elastic plate 7, enables placement of a disk drive or reader 3, first by mating the fixation holes on one side of the disk drive or reader 3 with the pins 1031A, 1031B of the support part 1, and then by tilting the housing by pivoting it into engagement with the elastic plate, to allow the pins of the elastic plate to recoil and be seated in the mounting or fixation holes located on the opposite face of the housing of the disk drive or reader 3.

Figure 10:
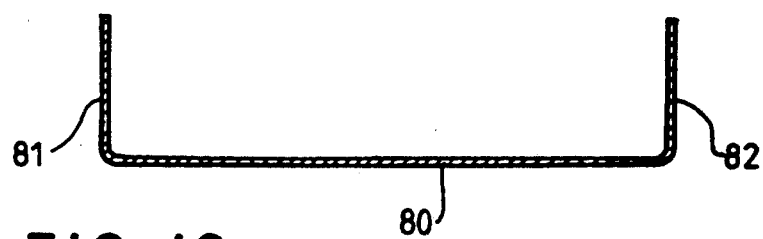
FIG. 10 is a front sectional view of the same device.
Figure 9A:
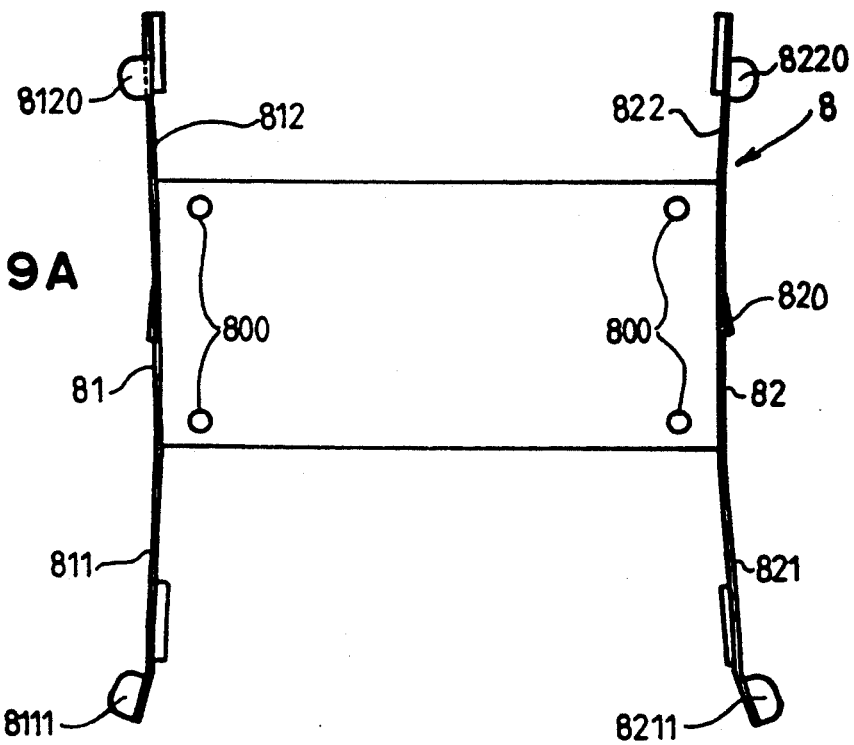
FIG. 9A is a plan view of the stirrup with a tilting arm, comprising a third mounting or fixation means.
Figure 9B:
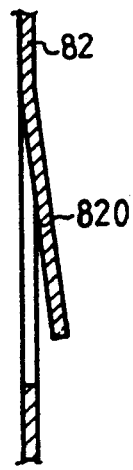
FIG. 9B is a sectional view of one of the side shanks of the stirrup of FIG. 9A.

The mounting or fixation of the hard disk 2 is assured by a stirrup or cradle 8, the main cross section of which is in the form of a U, as shown in FIGS. 9A, 9B and 10. The side shanks 81, 82 of the stirrup are extended to the front and back by lateral arms 811, 812, 821, 822. Each of the arms is extended outward by a tongue 8120, 8111, 8211, 8220 in a direction perpendicular to the shanks 81, 82 and parallel to the horizontal plane 80 to which the peripheral is fixed. The horizontal plane 80 includes a series of four holes 800 enabling mounting or fixation of the peripheral on the linking part of the stirrup. The front and rear arms 811, 812, 821, 822 form a small angle with the extensions of the side surfaces 81, 82. This small angle provides clearance for the elastic arm of the mounting or fixation device. This clearance enables the introduction of the tongues 8120, 8220 into the respective holes 1020A, 1020B (FIGS. 4 and 3). The holes 1020A, 1020B, 1020C, 1020D are made in stamped tabs of the surface 10, after a portion thereof has been folded in such a way that the axis of symmetry of the holes 1020A, 1020B is parallel with the surfaces 10, 11, 12 to form a reinforcement of the surface 10. Similarly, at a distance corresponding to the distance separating the tongues 8120, 8220 from the tongues 8111, 8211, corresponding holes 1020C, 1020D are located on the support part 1, and the tongues 8111, 8211 can penetrate these holes after deformation of the elastic arms 811, 821. Mounting of the peripheral 2 is done first by effecting its fixation to the linking part of stirrup 8. The rear arms 812, 822 are then introduced in such a manner that the tongues 8120, 8220 penetrate the openings 1020A, 1020B, slightly deforming these arms inward. Next, the tilting of the housing progressively moves the front tongues 8111, 8211 so that they face the openings 1020C and 1020D, by deforming the arms 811, 821 inward. After the arms 811, 821 have relaxed, the tongues penetrate the openings and securely retain the assembly peripheral and stirrup on support part 1. For access to the connector 60, it is sufficient to press on the arms 811, 821 to disengage the tongues from the corresponding holes, and thus to enable tilting of the peripheral.

The support part 1, equipped with one or more peripherals depending on the desired configuration, and corresponding to the equipment shown in FIG. 1, in one preferred configuration, or to the equipment shown in FIG. 3, in another preferred configuration, is then introduced into the chassis of the machine, which is made of a front panel 90 (FIG. 2) and a rear panel 91, integrally joined by a sheet-metal bottom 92, on which a printed wiring board 6 rests. The support part 1 is slid in such a way that its side surface 11 is guided and retained by bosses 900 made on the front panel 90 of the chassis and bosses 910 made on the rear panel 91 of the chassis. These bosses 900, 910 are disposed on either side of the location in which the side surface 11 must be maintained. Stamped tongues 901 on the front panel 90 and 915 on the rear panel 91, which are bent perpendicular to these panels 90, 91, make it possible to secure the support part to the chassis by way of the extensions of the surface 11, which are made by fixation elements 111 and 110 located to the front and rear, respectively, of the support part 1 (see FIG. 3). Similarly, a front nut that via a tongue 125 is securely attached to the surface 12 makes it possible to join this surface 12 to the front face 90 via a screw 1250, shown in FIG. 2. Finally, the tab 124 makes it possible to secure a screw, so as to join the surface 12 solidly to the printed circuit 6 and to the lower face 92 of the chassis, as shown in FIG. 6.

From the above description, it will be understood that a peripheral mounting or device has thus been achieved which makes it possible to equip a machine with various options in terms of peripherals to meet customer requirements, in a simple and economical fashion. Additionally, the simplicity of mounting the various peripherals enables automation and easy access to the main parts of the machine for maintenance work.

Any modifications within the competence of one skilled in the art may be made without departing from the spirit and scope of the invention.

What is claimed is:

1. A mounting device for computer peripherals comprising a support part (1), removably attachable to a chassis (90, 91, 92) of a microcomputer, said support part (1) comprising a first (10), a second (12), and a third surface (11), said second and third surfaces (12, 11) being mutually parallel and perpendicular to the first surface (10), thereby forming U-shaped part with two downwardly extending shanks, said first surface (10) comprising first mounting means for mounting a first peripheral (3) to said support part at a side of said first surface opposite said downwardly extending shanks, said support part (1) being adapted to receive a second means for removable mounting of a second peripheral (4), said second mounting means to be mounted between the shanks of the U-shaped support part (1).

2. The mounting device for computer peripherals defined by claim 1 further comprising detachable fixation means for attaching said mounting device to front and rear panels of a computer chassis and to a printed wiring board resting on a bottom of the computer chassis, wherein the mounting device is adapted to be mounted in said computer chassis having a bottom panel, a front panel and a rear panel by sliding said mounting device between grooves made by bosses (900, 910) on front (90) and rear (91) panels of the computer chassis and is adapted to be attached to the panels and to the printed wiring board (6) resting of the bottom (92) of the computer chassis by said detachable fixation means (111, 110, 124).

3. The mounting device as defined by claim 1, wherein said device further comprises third means for mounting a third peripheral, and said device includes an opening (102) provided in the first surface (10), behind the first mounting means for a first peripheral (3), said opening being adapted to receive said third means (8) for fixation of said third peripheral (2) mounted in a direction perpendicular to the direction of the first peripheral (3), said third means (8) being pivotably attached to said first surface at said opening to enable temporary tilting of the peripheral (2) whereby, when said peripheral is tilted out of said opening, access is permitted to a connector (60) located on a printed wiring board (6) on which the support part (1) is mountable.

4. A mounting device for computer peripherals comprising a support part (1), removably attachable to a chassis (90, 91, 92) of a microcomputer, said support part (1) comprising a first (10), a second (12), and a third surface (11), said second and third surfaces (12, 11) being mutually parallel and perpendicular to the first surface (10), thereby forming U-shaped part with two downwardly extending shanks, said first surface (10) comprising first mounting means for mounting a first peripheral (3) to said support part at a side of said first surface opposite said downwardly extending shanks, said support part (1) being adapted to receive a second means for removable mounting of a second peripheral (4), said second mounting means to be mounted between the shanks of the U-shaped support part (1), and wherein a first set of pins (103) is disposed on said first surface (10) and an elastic plate (7) is disposed perpendicularly to said first surface (10) and parallel to said first set of pins (103), said plate being fixed to one (12) of said second or third surfaces perpendicular to the first surface (10), said elastic plate having a second set of pins (73) formed therein, said second set of pins (73) being spaced at a distance from said first set of pins, whereby a distance between said first and second sets of pins corresponds to the spacing of fixation openings disposed on the first peripheral housing (3), and wherein each of said second set of pins penetrates a corresponding fixation opening when said peripheral is mounted on said device.

5. The mounting device as defined by claim 4, wherein said elastic plate (7) is removably mounted on said second surface (12) said second surface being perpendicular to and integral with said first surface (10) and disposed in a direction opposite that of said first set of pins (103), said plate (7) having two stamped tabs (710A, 710B) and receptacles (7110, 7130), said second surface having two tongues (121A, 121B, and two bosses (125A, 125B) formed by stamping and deformation of said second surface, said tabs being adapted to be placed under said two tongues (121A, 121B) of said second surface (12), said bosses being disposed to clip into corresponding receptacles (7110, 7130) on said elastic plate.

6. The mounting device as defined by claim 5, further comprising second mounting means for mounting a second peripheral, said second mounting means comprising a pair of stamped cutouts disposed in each of the second (12) and the third (11) surfaces, each of said cutouts comprising a vertical cutout portion and a laterally extending inclined ramp portion, said inclined ramp portion terminating with a locking point.

7. The mounting device as defined by claim 6, wherein said mounting device further comprises third means for mounting a third peripheral, and said device includes an opening (102) provided in the first surface (10), behind the first mounting means for a first peripheral (3), said opening being adapted to receive said third means (8) for fixation of said third peripheral (2) mounted in a direction perpendicular (3), said third means (8) being pivotably attached to said first surface at said opening to enable temporary tilting of the peripheral (2) whereby, when said peripheral is tilted out of said opening, access is permitted to a connector (60) located on a printed wiring board (6) on which the support part (1) is mountable.

8. The mounting device as defined by claim 7, wherein the third fixation means (8) comprises a U-shaped stirrup (80, 81, 82) having two side shanks and a central portion, the side shanks (81, 82) of which are extended to the front and rear of the central portion of the U by two pairs of arms (812, 811, 821, 822), of which at least a first pair of arms (812, 822) disposed facing one another are pivotably connected to the sides of the opening (102) by means disposed on said first pair of arms for pivotably connecting said arms to the sides of the opening, and wherein a second pair of arms (811, 821) includes means for snap locking to the surfaces of the opening provided for this purpose, to constitute the position for use of the peripheral (2), and wherein the second pair of arms (811, 821) are sufficiently elastic to enable said arms to be disengaged from the snap-locked condition to allow the tilting.

9. The mounting device as defined by claim 5, further comprising second mounting means for mounting a second peripheral, said second mounting means comprising a U-shaped stirrup (50, 51, 52) having a surface (50) which is adapted to be horizontally disposed when said second mounting means is mounted on said support part, and having two upwardly oriented shanks, said stirrup being removably mounted via a joint (520, 123) and suspended from the first surface (10) by an elastic tongue (510, 511) adjacent a first shank including an interlocking tongue (512) said interlocking tongue extending through an opening (104) of the first surface (10), pressing against an upper face of the first surface (10), the first shank (51) of the U resting against a lower face of the first surface (10) in proximity with the interlocking tongue (52).

10. The mounting device as defined by claim 9, wherein said device further comprises third means for mounting a third peripheral, and said device includes an opening (102) provided in the first surface (10), behind the first mounting means for a first peripheral (3), said opening being adapted to receive said third means (8) for fixation of said third peripheral (2) mounted in a direction perpendicular to the direction of the first peripheral (3), said third means (8) being pivotably attached to said first surface at said opening to enable temporary tilting of the peripheral (2) whereby, when said peripheral is tilted out of said opening, access is permitted to a connector (60) located on a printed wiring board (6) on which the support part (1) is mountable.

11. The mounting device as defined by claim 10, wherein the third fixation means (8) comprises a U-shaped stirrup (80, 81, 82) having two side shanks and a central portion, the side shanks (81, 92) of which are extended to the front and rear of the central portion by the U by two pairs of arms (812, 811, 821, 822), of which at least a first pair of arms (812, 822) disposed facing one another are pivotably connected to the sides of the opening (102) by means disposed on said first pair of arms for pivotably connecting said arms to the sides of the opening, and wherein a second pair of arms (811, 821) includes means for snap locking to the surfaces of the opening provided for this purpose, to constitute the position for use of the peripheral (2), and wherein the second pair of arms (811, 821) are sufficiently elastic to enable said arms to be disengaged from the snap-locked condition to allow the tilting.

12. The mounting device as defined by claim 9, wherein the joint (123, 520) is integral with the second shank (52) of the U, and includes means for positioning the horizontal surface of the stirrup, said means comprising a folded edge (521) supported on the upper portion of a stamped tab (122) in the second surface (12), and wherein the tongues (520A, 520B) forming the joint are supported against lower portions of stamped tabs (123A, 123B) in the second surface (12).

13. The mounting device as defined by claim 12, wherein said device further comprises third means for mounting a third peripheral, and said device includes an opening (102) provided in the first surface (10), behind the first mounting means for a first peripheral (3), said opening being adapted to receive said third means (8) for fixation of said third peripheral (2) mounted in a direction perpendicular to the direction of the first peripheral (3), said third means (8) being pivotably attached to said first surface at said opening to enable temporary tilting of the peripheral (2) whereby, when said peripheral is tilted out of said opening, access is permitted to a connector (60) located on a printed wiring board (6) on which the support part (1) is mountable.

14. The mounting device as defined by claim 13, wherein the third fixation means (8) comprises a U-shaped stirrup (80, 81, 82) having two side shanks and a central portion, the side shanks (81, 82) of which are extended to the front and rear of the central portion of the U by two pairs of arms (812, 811, 821, 822), of which at least a first pair of arms (812, 822) disposed facing one another are pivotably connected to the sides of the opening (102) by means disposed on said first pair of arms for pivotably connecting said arms to the sides of the opening, and wherein a second pair of arms (811, 821) includes means for snap locking to the surfaces of the opening provided for this purpose, to constitute the position for use of the peripheral (2), and wherein the second pair of arms (811, 821) are sufficiently elastic to enable said arms to be disengaged from the snap-locked condition to allow the tilting.

15. The mounting device as defined by claim 5, wherein said device further comprises third means for mounting a third peripheral, and said device includes an opening (102) provided in the first surface (10), behind the first mounting means for a first peripheral (3), said opening being adapted to receive said third means (8) for fixation of said third peripheral (2) mounted in a direction perpendicular to the direction of the first peripheral (3), said third means (8) being pivotably attached to said first surface at said opening to enable temporary tilting of the peripheral (2) whereby, when said peripheral is tilted out of said opening, access is permitted to a connector (60) located on a printed wiring board (6) on which the support part (1) is mountable.

16. The mounting device as defined by claim 15, wherein the third fixation means (8) comprises a U-shaped stirrup (80, 81, 82) having two side shanks and a central portion, the side shanks (81, 82) of which are extended to the front and rear of the central portion of the U by two pairs of arms (812, 811, 821, 822), of which at least a first pair of arms (812, 822) disposed facing one another are pivotably connected to the sides of the opening (102) by means disposed on said first pair of arms for pivotably connecting said arms to the sides of the opening, and wherein a second pair of arms (811, 821) includes means for snap locking to the surfaces of the opening provided for this purpose, to constitute the position for use of the peripheral (2), and wherein the second pair of arms (811, 821) are sufficiently elastic to enable said arms to be disengaged from the snap-locked condition to allow the tilting.

17. A mounting device for computer peripherals comprising a support part (1), removably attachable to a chassis (90, 91, 92) of a microcomputer, said support part (1) comprising a first (10), a second (12), and a third surface (11), said second and third surfaces (12, 11) being mutually parallel and perpendicular to the first surface (10), thereby forming U-shaped part with two downwardly extending shanks, said first surface (10) comprising first mounting means for mounting a first peripheral (3) to said support part at a side of said first surface opposite said downwardly extending shanks, said support part (1) being adapted to receive a second means for removable mounting of a second peripheral (4), said second mounting means to be mounted between the shanks of the U-shaped support part (1), and wherein said device further comprises third means for mounting a third peripheral, and said device includes an opening (102) provided in the first surface (10), behind the first mounting means for a first peripheral (3), said opening being adapted to receive said third means (8) for fixation of said third peripheral (2) mounted in a direction perpendicular to the direction of the first peripheral (3), said third means (8) being pivotably attached to said first surface at said opening to enable temporary tilting of the peripheral (2), whereby, when said peripheral is tilted out of said opening, access is permitted to a connector (60) located on a printed wiring board (6) on which the support part (1) is mountable, and wherein the third fixation means (8) comprises a U-shaped stirrup (80, 81, 82) having two side shanks and a central portion, the side shanks (81, 82) of which are extended to the front and rear of the central portion of the U by two pairs of arms (812, 811, 821, 822), of which at least a first pair of arms (812, 822) disposed facing one another are pivotably connected to the sides of the opening (102) by means disposed on said first pair of arms for pivotably connecting said arms to the sides of the opening, and wherein a second pair of arms (811, 821) includes means for snap locking to the surfaces of the opening provided for this purpose, to constitute the position for use of the peripheral (2), and wherein the second pair of arms (811, 821) are sufficiently elastic to enable said arms to be disengaged from the snap-locked condition to allow the tilting.

* * * * *

UNITED STATES PATENT AND TRADEMARK OFFICE
CERTIFICATE OF CORRECTION

PATENT NO. : 5,136,466
DATED : August 4, 1992
INVENTOR(S) : Remise, et al

It is certified that error appears in the above-identified patent and that said Letters Patent is hereby corrected as shown below:

Col. 9, line 32 (Claim 11, line 4) "(81,92)" should be --(81,82)--.

Signed and Sealed this

Twenty-third Day of November, 1993

Attest:

BRUCE LEHMAN

Attesting Officer     Commissioner of Patents and Trademarks